United States Patent
Reinold et al.

(10) Patent No.: US 8,181,845 B2
(45) Date of Patent: May 22, 2012

(54) ELECTRICAL BOND CONNECTION SYSTEM

(75) Inventors: Manfred Reinold, Schwieberdingen (DE); Immanuel Mueller, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/736,711

(22) PCT Filed: Apr. 3, 2009

(86) PCT No.: PCT/EP2009/053987
§ 371 (c)(1),
(2), (4) Date: Feb. 7, 2011

(87) PCT Pub. No.: WO2009/135737
PCT Pub. Date: Nov. 12, 2009

(65) Prior Publication Data
US 2011/0121059 A1   May 26, 2011

(30) Foreign Application Priority Data
May 9, 2008   (DE) .......................... 10 2008 001 671

(51) Int. Cl.
*B23K 31/02* (2006.01)
(52) U.S. Cl. ... 228/180.5; 228/4.5; 228/904; 228/110.1; 228/1.1; 438/614; 438/617
(58) Field of Classification Search ............... 228/180.5, 228/4.5, 904, 110.1, 1.1; 438/614, 617
See application file for complete search history.

(56) References Cited

U.S. PATENT DOCUMENTS

| | | |
|---|---|---|
| 3,911,567 A | 10/1975 | Hofer |
| 4,513,355 A | 4/1985 | Schroeder et al. |
| 2004/0217488 A1 | 11/2004 | Luechinger |
| 2005/0258538 A1 | 11/2005 | Gerber |
| 2006/0186554 A1 | 8/2006 | Otremba |
| 2008/0193719 A1* | 8/2008 | Delsman et al. ............. 428/157 |

FOREIGN PATENT DOCUMENTS

| | | |
|---|---|---|
| DE | 100 65 722 | 4/2002 |
| DE | 103 24 069 | 12/2004 |
| DE | 10 2005 004 | 8/2006 |
| DE | 10 2006 025 | 12/2007 |
| EP | 1 098 328 | 5/2001 |
| JP | 01 268 038 | 10/1989 |
| WO | WO 2006/007825 | 1/2006 |

OTHER PUBLICATIONS

George E. Harmon, "Wire Bonding in Microelectronics Materials, Processes, Reliability and Yield", Ultrasonic Bonding Systems and Technologies, McGraw-Hill, USA, pp. 18-23, XP-002534712.
George G. Harman: "Wire Bonding in Microelectronics Materials, Processes, Reliability, and Yield," 1997, McGraw Hill, USA (Table of Contents).

* cited by examiner

*Primary Examiner* — Kiley Stoner
*Assistant Examiner* — Erin Saad
(74) *Attorney, Agent, or Firm* — Kenyon & Kenyon LLP

(57) ABSTRACT

An electrical bond connection system between a first electrical contact surface and a second electrical contact surface having at least one first electrical conductor, which is bonded to at least one of the contact surfaces via at least one first bond connection. At least one additional second electrical conductor (9) is bonded to the first electrical conductor (8) via at least one second bond connection (10, 13), the two bond connections (10) being offset from one another. The present invention also relates to a method for manufacturing an electrical bond connection system existing between a first electrical contact surface and a second electrical contact surface.

8 Claims, 1 Drawing Sheet

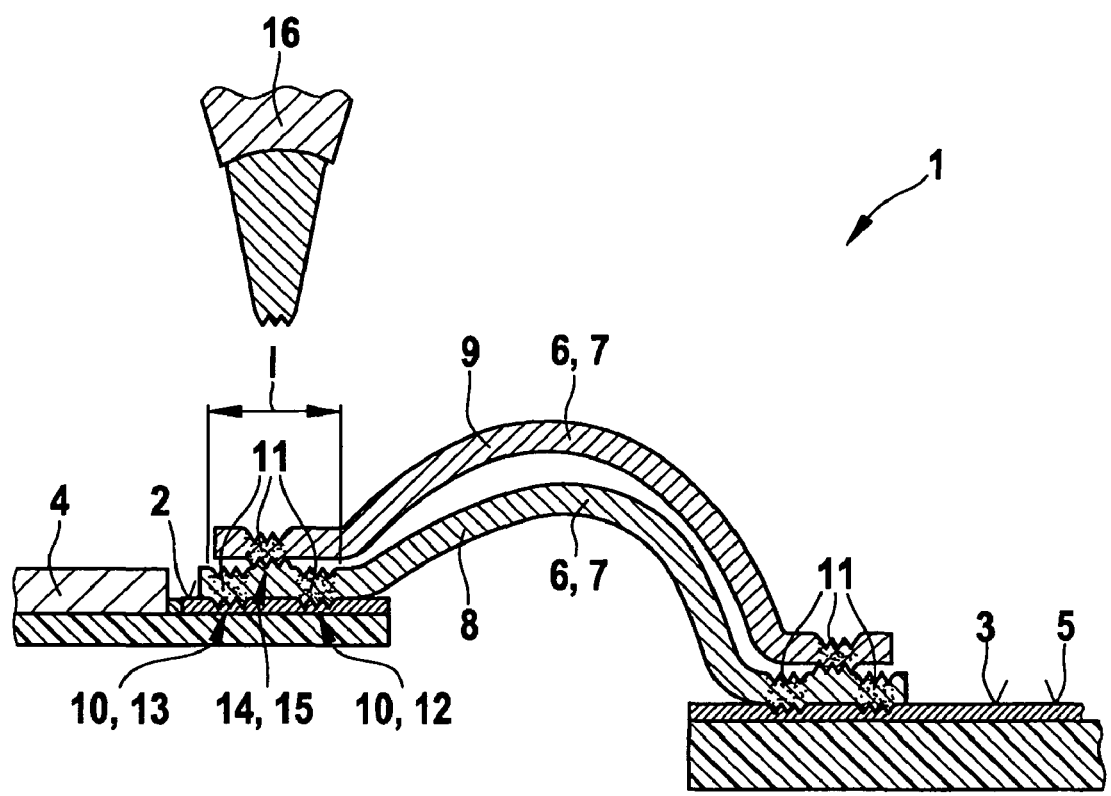

ELECTRICAL BOND CONNECTION SYSTEM

BACKGROUND OF THE INVENTION

1. Field of the Invention

The present invention relates to an electrical bond connection system between a first electrical contact surface and a second electrical contact surface.

2. Description of Related Art

Electronic circuits are increasingly in use in performance areas in which high currents occur. In the automotive field in particular, high-current applications are being increasingly used. At the present time, aluminum ribbons having more or less square cross sections are being used in ultrasonic bonding technology for transmitting high currents between electronic circuits and terminals for these electronic circuits, i.e., between a naked chip application and the circuit board holding the latter, for example. To achieve a sufficiently high current-carrying capacity, it is sometimes necessary to bond multiple individual ribbons side by side, which results in space problems as well as substantial restrictions on the freedom of layout and design with regard to such applications. Moreover, it is impossible in some cases to implement a desired circuit because the corresponding high current-carrying connection is impossible using the means currently available in the related art.

SUMMARY OF THE INVENTION

An object of the present invention is to provide an electrical bond connection system between two electrical contact surfaces, ensuring a high current-carrying capacity in a relatively small space by a simple manufacturing method.

An electrical bond connection system between a first electrical contact surface and a second electrical contact surface is proposed, having at least one first electrical conductor, which is bonded to at least one of the contact surfaces via at least one first bond connection. It is proposed that at least one additional second electrical conductor is bonded to the first electrical conductor by at least one second bond connection, the two bond connections being offset from one another. The first contact surface is formed in the area of the electronic chip, for example, whereas the second contact surface is formed on a copper side facing the circuit board. The two contact surfaces are electrically insulated from one another and are bridged by the bond connection system. To that end, the first electrical conductor is bonded by the bond connection to at least one of the contact surfaces (it may also be attached to the other contact surface by another method, for example, and connected there in an electrically conductive manner). What is novel here in comparison with the connections known in the related art is that at least one additional second electrical conductor is bonded to the first electrical conductor via the second bond connection. The two bond connections are offset relative to one another. This means that the bond connection, which affixes the first electrical conductor to the particular contact surface and electrically connects it, is not in direct contact with the second bond connection bonding the second electrical conductor to the first bond connection so as not to risk detaching the first bond connection when applying the second bond connection.

BRIEF DESCRIPTION OF THE DRAWINGS

FIG. 1 shows a bond connection system having two electrical conductors.

DETAILED DESCRIPTION OF THE INVENTION

In one specific embodiment of the present invention, at least one of the conductors is designed as a ribbon bond. Ribbon bonds are known in the related art; such ribbon bonds, which do not have a square cross section, as is customary in the related art, but instead have an essentially rectangular cross section, are preferred here. This offers advantages from the point of view of process technology in the course of the bonding method because the bond connection is manufacturable more easily and more reliably if there is a smaller cross-sectional area in the vertical extent between the bonding tool and the contact surface.

In a preferred specific embodiment, at least one of the bond connections is a flat or linear bond connection. The bond connection between the conductor and the contact surface is consequently designed as a flat or of linear shape.

The bond connections are preferably present in particular on the ribbon bonds as contact strips running crosswise to the longitudinal extent of the ribbon, these strips being offset from one another as seen in the longitudinal direction of the ribbon. Thus, for example, a first bond connection, a bond foot, is formed on the first electrical conductor, which is designed as a ribbon bond, and at a slight distance from that another, the second bond foot, is present in its longitudinal extent. This second electrical conductor, preferably also designed as a ribbon bond, is bonded to the first ribbon bond via another bond connection, this bond connection, the third bond foot, being located in an area between the first and second bond feet, which are formed on the first ribbon bond, so that neither the first nor the second bond foot of the first ribbon bond is detached from the contact surface in being attached.

The bond connections are preferably designed as ultrasonic bond connections and/or thermal bond connections. Consequently, known devices and tools, which are present in the particular production shops and are known in the related art, are preferably used to manufacture the bond connection systems according to the present invention, so that the advantages of the bond connection system according to the present invention may be utilized here without any mentionable investments. The process engineering is implemented in the software, in such a way that two given points, as provided in the related art, are supplemented by calculated addition of the additional points required to manufacture the bond connection system.

Furthermore, a method for manufacturing an electrical bond connection system existing between a first electrical contact surface and a second electrical contact surface, in particular as described above is provided, at least one first electrical conductor being bonded to at least one of the contact surfaces via at least one first bond connection. Another step is provided, in which at least one additional second electrical conductor is bonded to the first electrical conductor via at least one second bond connection in such a way that the two bond connections are offset from one another.

The method is preferably implemented in such a way that the following steps are performed:

bonding the first electrical conductor to the first electrical contact surface, forming the first bond connection;

applying a second bond connection to the same electrical conductor, this second bond connection being offset from the first bond connection;

bonding the additional second electrical conductor to the first electrical conductor via another, third bond connection, the latter being offset from the first and second bond connections, which are formed on the first electrical conductor.

The bond connections are preferably designed to be offset from one another in the longitudinal extent of the electrical conductors, i.e., in sequential order to a certain extent. This very reliably prevents detachment of existing bond connections when bonding one of the subsequent bond connections.

The bond connections are preferably designed in particular in such a way that the third bond connection, viewed in the longitudinal extent, is positioned between the first and second bond connections. The first and second bond connections are consequently positioned, as the first and second bond feet, at a distance from one another in succession on the first conductor, electrically connecting and affixing the first conductor to the first contact surface. The second electrical conductor is bonded to the first electrical conductor via the third bond connection, the third bond connection being positioned between the first and second bond connections, as seen in the longitudinal extent. A very good current-carrying capacity is thus achievable with high process reliability in production.

The present invention is explained in greater detail below on the basis of exemplary embodiments without being limited thereto. As already described, the additional third bond connection is offset from the first and second bond connections, which are formed on the first electrical conductor.

The figure shows a bond connection system 1 between a first electrical contact surface 2 and a second electrical contact surface 3. First electrical contact surface 2 here belongs to a semiconductor module 4, for example, whereas the second electrical contact surface 3 is a copper surface 5 for circuit contacting. Electrical conductors 6, namely ribbon bonds 7, are provided between electrical contact surface 2, 3 to establish the bond connection system 1. Ribbon bonds 7 are bonded to electrical contact surfaces 2, 3, in particular by ultrasonic bonding or thermal bonding. Of electrical conductors 6, one, namely first electrical conductor 8, is applied first, whereas second electrical conductor 9 is bonded not to electrical contact surfaces 2, 3 but instead to first electrical conductor 8. First electrical conductor 8 is applied to first electrical contact surface 2 via two bond connections 10, each forming bond feet 11, namely a first bond connection 12 and a second bond connection 13, so that these are offset from one another, namely in the longitudinal extent, as seen in longitudinal extent I of first electrical conductor 8. Second electrical conductor 9 is then bonded to first electrical conductor 8, namely using a third bond connection 14 in an intermediate bonding area 15. Consequently, first bond connection 12 and second bond connection 13 are spaced a distance apart from one another in longitudinal extent I of first electrical conductor 8, thus forming intermediate connection area 15 between them, to which third bond connection 14 of second electrical conductor 9 is applied. Bond connections 10 are applied by a bonding tool 16, which is shown here only very schematically. A similar procedure is followed on second electrical contact surface 3. In this way, an inexpensive bond connection system 1 capable of carrying a high current is manufacturable using bonding tools 16 known from the related art, the space problems and process problems known from the related art being avoided by using large cross-section heights (in particular by square cross sections) of the electrical conductors. By placing bond connections 10 offset and at a distance from one another, namely first bond connection 12 and second bond connection 13, sufficient space is advantageously created for the access of bonding tool 16, in particular also for the severing/cutting (not shown here) of the continuously supplied material of electrical conductor 6. It is possible in this way to ensure that no damage occurs in applying second electrical conductor 9 to first electrical conductor 8 in the manufacture of third bond connection 14, so that fully automatic mass production at a relatively high speed is made possible. In particular in manufacturing bond connection system 1 via integrated bonding tools 16, which supply the material continuously to electrical conductors 6, perform bond connections 10 and cut off the material of particular electrical conductor 6, this system is very advantageous because mechanical damage to bond connections 10 already created, in particular first and second bond connections 12, 13, is prevented when the material of electrical conductor 6, namely second electrical conductor 9, is cut off, after manufacturing third bond connection 14. Unwanted thermal or ultrasonic influences are likewise prevented or at least minimized.

What is claimed is:

1. An electrical bond connection system between a first electrical contact surface and a second electrical contact surface, comprising: at least one first electrical conductor, which is bonded to at least one of the contact surfaces via at least one first bond connection and a second bond connection; and at least one additional electrical conductor, which is bonded to the first electrical conductor via at least one additional bond connection, at least one of the conductors being designed as a ribbon bond, wherein the bond connections are designed as contact strips running crosswise to the longitudinal extent of the ribbon on the ribbon bonds and are offset from one another, as seen in the longitudinal direction of the ribbon, the additional bond connection being positioned in an intermediate connection area, which is formed between the first bond connection and the second bond connection.

2. The bond connection system as recited in claim 1, wherein at least one of the bond connections is a flat or linear bond connection.

3. The bond connection system as recited in claim 1, wherein the bond connections are designed as at least one of ultrasonic bond connections and thermal bond connections.

4. The bond connection system as recited in claim 2, wherein the bond connections are designed as at least one of ultrasonic bond connections and thermal bond connections.

5. A method for manufacturing an electrical bond connection system between a first electrical contact surface and a second electrical contact surface, comprising:
bonding at least one first electrical conductor to at least one of the contact surfaces via at least one first bond connection and a second bond connection; and bonding at least one additional electrical conductor to the first electrical conductor via at least one additional bond connection, wherein the bond connections are offset from one another in the longitudinal extent of the electrical conductors, the additional bond connection being in an intermediate connection area, which is formed between the first bond connection and the second bond connection.

6. The method as recited in claim 5, further comprising:
bonding the first electrical conductor to the first electrical contact surface, forming the first bond connection;
applying the bond connection to the same electrical conductor, wherein this second bond connection is offset from the first bond connection; and
bonding the additional, second electrical conductor to the first electrical conductor via another bond connection, the latter being offset from the first and second bond connections, which are formed on the first electrical conductor.

7. The method as recited in claim 5, wherein the third bond connection—as seen in the longitudinal extent—is formed between the first and second bond connections.

8. The method as recited in claim 6, wherein the third bond connection—as seen in the longitudinal extent—is formed between the first and second bond connections.

* * * * *